(12) United States Patent
Iimuro

(10) Patent No.: US 8,343,280 B2
(45) Date of Patent: Jan. 1, 2013

(54) MULTI-ZONE SUBSTRATE TEMPERATURE CONTROL SYSTEM AND METHOD OF OPERATING

(75) Inventor: Shunichi Iimuro, Burlington, MA (US)

(73) Assignee: Tokyo Electron Limited (JP)

( * ) Notice: Subject to any disclaimer, the term of this patent is extended or adjusted under 35 U.S.C. 154(b) by 2072 days.

(21) Appl. No.: 11/390,471

(22) Filed: Mar. 28, 2006

(65) Prior Publication Data

US 2007/0235134 A1 Oct. 11, 2007

(51) Int. Cl.
*H01L 21/00* (2006.01)
*C23C 16/00* (2006.01)

(52) U.S. Cl. .............. 118/724; 156/345.27; 156/345.52; 156/345.53; 62/3.3; 62/3.7; 136/200

(58) Field of Classification Search .................. 118/724, 118/725, 728; 156/345.51, 345.52, 345.53, 156/345.27; 62/3.3, 3.7; 136/200
See application file for complete search history.

(56) References Cited

U.S. PATENT DOCUMENTS

| | | | |
|---|---|---|---|
| 4,492,610 A | 1/1985 | Okano et al. | |
| 4,716,957 A | 1/1988 | Thompson et al. | |
| 4,838,978 A | 6/1989 | Sekine et al. | |
| 5,240,556 A | 8/1993 | Ishikawa et al. | |
| 5,273,588 A | 12/1993 | Foster et al. | |
| 5,282,925 A | 2/1994 | Jeng et al. | |
| 5,622,566 A | 4/1997 | Hosaka et al. | |
| 5,622,639 A | 4/1997 | Kitayama et al. | |
| 5,733,426 A | 3/1998 | Cox et al. | |
| 5,769,952 A | 6/1998 | Komino | |
| 5,776,557 A | 7/1998 | Okano et al. | |
| 5,802,856 A * | 9/1998 | Schaper et al. | 62/3.7 |
| 5,838,055 A | 11/1998 | Kleinhenz et al. | |
| 5,876,879 A | 3/1999 | Kleinhenz et al. | |
| 6,026,764 A | 2/2000 | Hwang et al. | |
| 6,071,815 A | 6/2000 | Kleinhenz et al. | |
| 6,074,951 A | 6/2000 | Kleinhenz et al. | |
| 6,099,651 A | 8/2000 | Sajoto et al. | |

(Continued)

FOREIGN PATENT DOCUMENTS

JP 2004-259829 9/2004
(Continued)

OTHER PUBLICATIONS

International Preliminary Report on Patentability issued in Application No. US07/067479 mailed Jan. 8, 2009.

(Continued)

*Primary Examiner* — Ram N. Kackar

(57) ABSTRACT

A method and system for multi-zone control of temperature for a substrate is described. The temperature control system comprises a heat exchanger coupled to two or more fluid channels in a substrate holder configured to support the substrate. The heat exchanger is configured to adjust the temperature of a heat transfer fluid flowing through the two or more fluid channels. The temperature control system further comprises a heat transfer unit having an inlet that is configured to receive heat transfer fluid from the heat exchanger at a bulk fluid temperature. Additionally, the heat transfer unit comprises a first outlet configured to couple a portion of the heat transfer fluid at a first temperature less than the bulk temperature to a first fluid channel of the two or more fluid channels, and a second outlet configured to couple a remaining portion of the heat transfer fluid at a second temperature greater than the bulk fluid temperature to a second fluid channel of the two or more fluid channels.

20 Claims, 12 Drawing Sheets

U.S. PATENT DOCUMENTS

| | | | |
|---|---|---|---|
| 6,165,271 | A | 12/2000 | Zhao et al. |
| 6,245,619 | B1 | 6/2001 | Boyd et al. |
| 6,258,170 | B1 | 7/2001 | Somekh et al. |
| 6,271,094 | B1 | 8/2001 | Boyd et al. |
| 6,284,006 | B1 | 9/2001 | Siefering et al. |
| 6,335,261 | B1 | 1/2002 | Natzle et al. |
| 6,527,865 | B1 | 3/2003 | Sajoto et al. |
| 6,672,076 | B2 * | 1/2004 | Bell ............................ 62/3.3 |
| 6,677,167 | B2 * | 1/2004 | Kanno et al. ................. 438/14 |
| 6,807,971 | B2 | 10/2004 | Saito et al. |
| 6,891,124 | B2 | 5/2005 | Denton et al. |
| 6,951,821 | B2 | 10/2005 | Hamelin |
| 7,029,536 | B2 | 4/2006 | Hamelin |
| 7,079,760 | B2 | 7/2006 | Hamelin |
| 7,347,901 | B2 | 3/2008 | Fink et al. |
| 2001/0016226 | A1 | 8/2001 | Natzle et al. |
| 2002/0002947 | A1 | 1/2002 | Satoyoshi et al. |
| 2002/0011216 | A1 | 1/2002 | Nguyen et al. |
| 2002/0015855 | A1 | 2/2002 | Sajoto et al. |
| 2002/0028555 | A1 | 3/2002 | Boyd et al. |
| 2002/0056417 | A1 | 5/2002 | Yonemizu et al. |
| 2002/0063110 | A1 | 5/2002 | Cantell et al. |
| 2002/0189757 | A1 | 12/2002 | Denton et al. |
| 2002/0195201 | A1 | 12/2002 | Beer et al. |
| 2004/0020601 | A1 | 2/2004 | Zhao et al. |
| 2004/0182315 | A1 | 9/2004 | Laflamme et al. |
| 2004/0182417 | A1 | 9/2004 | Hamelin et al. |
| 2004/0184792 | A1 | 9/2004 | Hamelin et al. |
| 2004/0185583 | A1 | 9/2004 | Tomoyasu et al. |
| 2004/0185670 | A1 | 9/2004 | Hamelin et al. |
| 2004/0187787 | A1 * | 9/2004 | Dawson et al. ............... 118/728 |
| 2005/0211264 | A1 | 9/2005 | Kostenko et al. |
| 2005/0211386 | A1 | 9/2005 | Hamelin et al. |
| 2005/0218113 | A1 | 10/2005 | Yue |
| 2005/0218114 | A1 | 10/2005 | Yue et al. |
| 2005/0227494 | A1 | 10/2005 | Higuchi et al. |
| 2006/0027169 | A1 | 2/2006 | Tsukamoto et al. |
| 2006/0216941 | A1 | 9/2006 | Hasebe et al. |

FOREIGN PATENT DOCUMENTS

| | | |
|---|---|---|
| WO | WO 01/70517 | 9/2001 |
| WO | 2006022997 A2 | 3/2006 |

OTHER PUBLICATIONS

Office Action issued in U.S. Appl. No. 11/425,883 mailed Feb. 2, 2009.

Office Action issued in U.S. Appl. No. 11/390,470, mailed Nov. 7, 2008.

International Search Report issued in counterpart International Application No. PCT/US07/61037, dated Nov. 1, 2007.

Written Opinion issued in counterpart International Application No. PCT/US07/61037, dated Nov. 1, 2007.

International Search Report issued in Application No. PCT/US07/067479 mailed Jul. 14, 2008.

Written Opinion issued in Application No. PCT/US07/067479 mailed Jul. 14, 2008.

International Preliminary Report on Patentability issued in Application No. PCT/US07/061037 mailed Oct. 9, 2008.

Taiwanese office action issued in counterpart patent application TW096110748, issued on Apr. 15, 2011.

Chinese office action issued in counterpart patent application CN200780011490.3, issued on Jun. 2, 2011.

Chinese Office Action issued in Application No. 200780011490.3 mailed Jul. 8, 2010.

Japanese office action issued in counterpart patent application JP2009-503103, issued on Sep. 11, 2012.

* cited by examiner

MULTI-ZONE SUBSTRATE TEMPERATURE CONTROL SYSTEM AND METHOD OF OPERATING

CROSS-REFERENCE TO RELATED APPLICATIONS

The present invention is related to U.S. patent application Ser. No. 10/912,182 (ES-005), entitled "Method and System for Substrate Temperature Profile Control", filed Aug. 6, 2004; U.S. patent application Ser. No. 10/721,500 (PC0204A), entitled "Thermally Zoned Substrate Holder Assembly", filed Nov. 26, 2003; U.S. Provisional Application Ser. No. 60/458,043 (PC0262A), entitled "Method and System for Temperature Control of a Substrate", filed Mar. 28, 2003; and U.S. application Ser. No. 10/168,544 (PC003B), entitled "Method of Wafer Band-edge Measurement Using Transmission Spectroscopy and a Process for Controlling the Temperature Uniformity of a Wafer", filed on Jan. 5, 2001; the entire contents of these applications is incorporated herein by reference.

FIELD OF THE INVENTION

The present invention relates to a method and system for temperature control of a substrate, and more particularly to a substrate holder for temperature control of a substrate.

BACKGROUND OF THE INVENTION

It is known in semiconductor manufacturing and processing that various processes, including for example etch and deposition processes, depend significantly on the temperature of the substrate. The temperature of a substrate is affected by numerous processes, such as: plasma processes including ion bombardment, thermal processes including radiation, convection and conduction, and chemical processes including chemical reactions occurring at the surface of the substrate. Providing a proper temperature to the upper surface of the substrate holder can be utilized to control the temperature of the substrate.

SUMMARY OF THE INVENTION

According to an embodiment, a temperature control system includes a first fluid channel coupled to a first thermal region of a processing element in a processing system, and configured to receive a first flow of heat transfer fluid at a first fluid temperature. A second fluid channel is coupled to a second thermal region of the processing element in the processing system, and configured to receive a second flow of heat transfer fluid at a second fluid temperature. A heat exchanger unit is configured to provide a bulk flow of heat transfer fluid at a bulk fluid temperature, wherein the bulk flow of the heat transfer fluid supplies the first flow of the heat transfer fluid and the second flow of the heat transfer fluid. A heat transfer unit is coupled to the heat exchanger and configured to receive the bulk flow of heat transfer fluid, wherein the heat transfer unit is configured to provide the first flow of heat transfer fluid at the first fluid temperature and provide the second flow of heat transfer fluid at the second fluid temperature by transferring heat between a first heat transfer region through which the first flow passes and a second heat transfer region through which the second flow passes.

According to another embodiment, a method and program instructions of a computer readable medium control the temperature of a substrate held on a substrate holder using the temperature control system. A first heat transfer fluid is provided to the first fluid channel. A second heat transfer fluid is provided to the second fluid channel. A first fluid temperature of the first heat transfer fluid is controlled relative to a second fluid temperature of the second heat transfer fluid using the heat transfer unit.

According to yet another embodiment, temperature control system includes a first thermal region of a processing element in a processing system, configured to receive a first flow of heat transfer fluid at a first fluid temperature. A second thermal region of the processing element in the processing system is configured to receive a second flow of heat transfer fluid at a second fluid temperature. A heat transfer unit transfers heat between the first flow of heat transfer fluid and the second flow of heat transfer fluid such that the first temperature is different than the second fluid temperature.

DETAILED DESCRIPTION OF SEVERAL EMBODIMENTS

In the following description, in order to facilitate a thorough understanding of the invention and for purposes of explanation and not limitation, specific details are set forth, such as a particular geometry of the processing element and various shapes of the temperature control elements in the processing element. However, it should be understood that the invention may be practiced in other embodiments that depart from these specific details.

Nonetheless, it should be appreciated that, contained within the description are features which, notwithstanding the inventive nature of the general concepts being explained, are also of an inventive nature.

Figure 1:
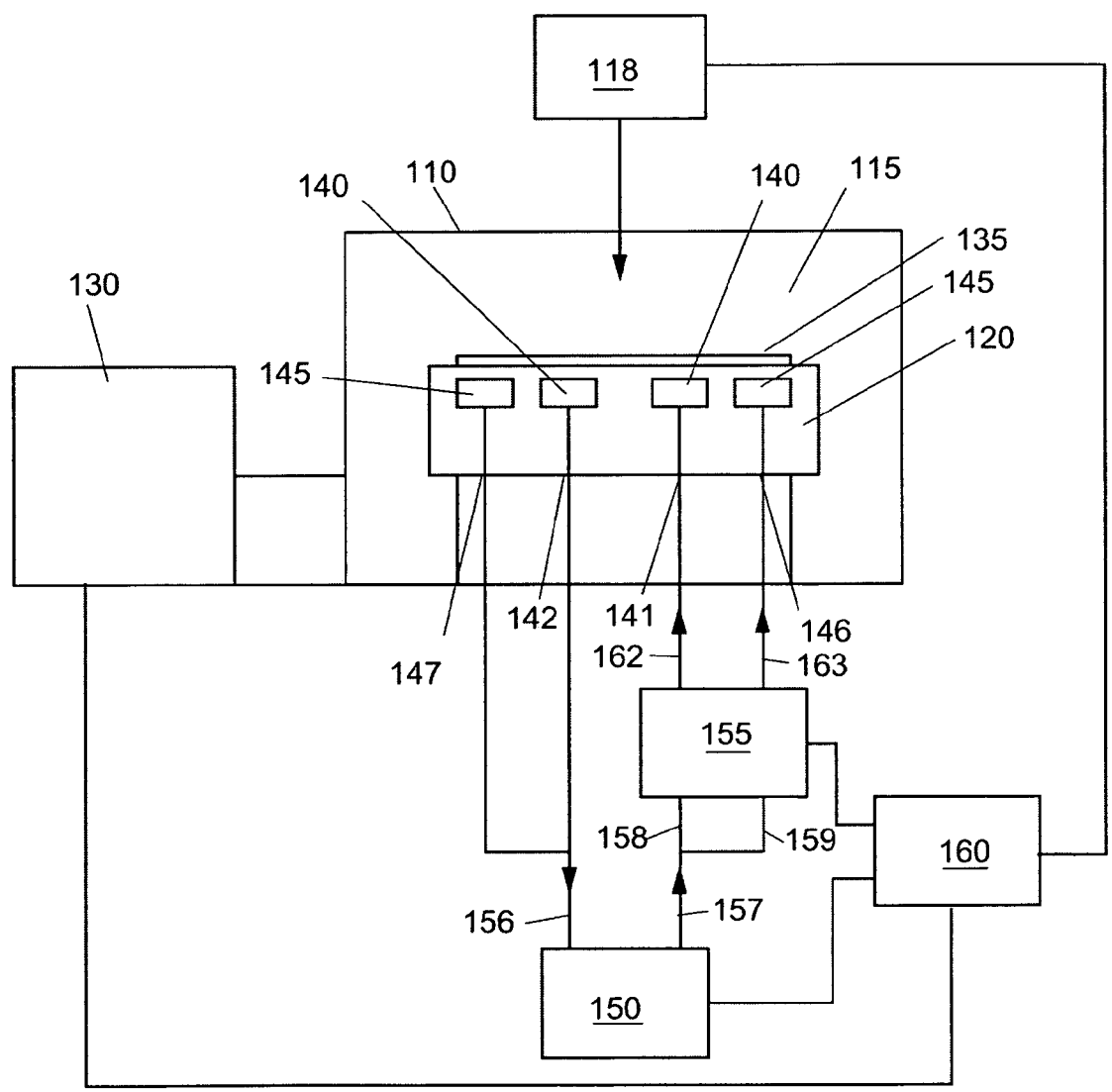
FIG. 1 depicts a simplified block diagram of a processing system having a substrate holder according to an embodiment of the invention.

According to an embodiment of the present invention, a material processing system 100 is depicted in FIG. 1 that includes a process tool 110 having a substrate holder 120 and a substrate 135 supported thereon. The substrate holder 120 is configured to provide at least two thermal zones arranged within the substrate holder 120 in order to provide temperature profile control and/or rapid adjustment of the substrate temperature within the material processing system 100. The thermal zones each can, for example, comprise a fluid channel for circulating a heat transfer fluid at a pre-specified flow rate and temperature with or without additional temperature control elements such as a resistive heating element or cooling elements, and/or some number of thermoelectric devices, etc. For clarity of presentation, fluid channels in the respective substrate holder represent thermal zones, and are exemplified in FIG. 1, FIG. 5, FIG. 6, FIG. 7, and FIG. 8.

In the illustrated embodiment depicted in FIG. 1, the material processing system 100 can facilitate a semiconductor processing system for fabricating integrated circuits (ICs). For example, the material processing system 100 may comprise a dry (plasma or non-plasma) etching system. Alternately, the material processing system 100 includes a photoresist coating chamber such as a heating/cooling module in a photoresist spin coating system that may be utilized for Post-Adhesion Bake (PAB) or Post-Exposure Bake (PEB), a photoresist patterning chamber such as Ultraviolet (UV) lithography system, a dielectric coating chamber such as Spin-On Glass (SOG) system, Spin-On Dielectric (SOD) system, a deposition chamber such as Chemical Vapor Deposition (CVD) system, a Physical Vapor Deposition (PVD) system, a Plasma Enhanced Chemical Vapor Deposition (PECVD) system, an Atomic Layer Deposition (ALD) system, a Plasma Enhanced ALD (PEALD) system, or a Rapid Thermal Processing (RTP) chamber, such as a RTP system for thermal annealing.

According to the illustrated embodiment depicted in FIG. 1, the material processing system 100 includes process tool 110, with a process volume 115, having substrate holder 120, upon which substrate 135 to be processed is affixed, gas injection system 118, and vacuum pumping system 130. Substrate 135 can be a semiconductor wafer or a liquid crystal display (LCD).

The substrate holder 120 is configured to support substrate 135, and control the temperature thereof. The temperature control system for the substrate holder 120 comprises a heat exchanger and heat transfer unit coupled to two or more fluid channels in the substrate holder 120, and configured to adjust the temperature of the heat transfer fluid flowing through one channel relative to the temperature of the heat transfer fluid flowing through another fluid channel by transferring heat from the fluid flow through one fluid channel to the fluid flow through another fluid channel.

As illustrated in FIG. 1, the substrate holder 120 comprises a first fluid channel 140, which is substantially circular, positioned in a central thermal zone of substrate holder 120, and a second fluid channel 145 in a peripheral (or edge) thermal zone of substrate holder 120, concentrically arranged about the first fluid channel 140. The first fluid channel 140 is configured to circulate heat transfer fluid provided at a corresponding inlet 141 to the substrate holder 120 and returned at a corresponding outlet 142 from the substrate holder 120. The second fluid channel 145 is configured to circulate heat transfer fluid provided at a corresponding inlet 146 to the substrate holder 120 and returned at a corresponding outlet 147 from the substrate holder 120.

A heat exchanger 150 is configured to provide a bulk flow of heat transfer fluid at a bulk fluid temperature and bulk flow rate at an outlet 157 of heat exchanger 150. Additionally, heat exchanger 150 can be configured to receive heat transfer fluid from outlet 142 of the first fluid channel 140 and outlet 147 of the second fluid channel 145 through inlet 156. The heat transfer fluid from outlets 142 and 147 can be discharged to heat exchanger 150, or they may be discharged to a separate collection bath. For example, the heat exchanger 150 can include a Model No. UBRPD5A-1T4 chiller, commercially available from Daikin Industries Limited. The heat exchanger 150 can be configured to operate with heat transfer fluid such as water, or a dielectric fluid, such as Fluorinert, Galden HT-135, or Galden HT-200. As would be understood by one of ordinary skill in the art, the heat transfer fluid may be any fluid configured to transport heat to or from substrate holder 120.

A fraction of the flow of heat transfer fluid from the heat exchanger 150 enters a first inlet 158 of a heat transfer unit 155 to form a first flow of heat transfer fluid through a first heat transfer region of the heat transfer unit 155, and another fraction of the flow of heat transfer fluid from the heat exchanger 150 enters a second inlet 159 of heat transfer unit 155 to form a second flow of heat transfer fluid through a second heat transfer region of the heat transfer unit 155. For example, one or more valves and optionally one or more flow measurement devices can be utilized to adjust the fraction of the flow of heat transfer fluid that enters the first inlet 158 relative to the fraction of flow of heat transfer fluid that enters the second inlet 159.

The heat transfer unit 155 can be configured to transfer heat from the first flow of heat transfer fluid to the second flow of heat transfer fluid, such that the first flow of heat transfer fluid exiting the heat transfer unit 155 at the inlet 141 of the first fluid channel 140 reaches a first fluid temperature less than or equal to the bulk fluid temperature, and the second flow of heat transfer fluid exiting the heat transfer unit 155 at the inlet 147 of the second fluid channel 145 reaches a second fluid temperature greater than or equal to the bulk fluid temperature. Alternatively, the heat transfer unit 155 is configured to transfer heat to the first flow of heat transfer fluid from the second flow of heat transfer fluid, such that the first flow of heat transfer fluid exiting the heat transfer unit 155 at the inlet 141 of the first fluid channel 140 reaches a first fluid temperature greater than or equal to the bulk fluid temperature, and the second flow of heat transfer fluid exiting the heat transfer unit 155 at the inlet 147 of the second fluid channel 145 reaches a second fluid temperature less than or equal to the bulk fluid temperature. The heat transfer unit 155 can be configured to transfer heat in either direction between the first and second flows of heat transfer fluid.

In one embodiment, heat transfer unit 155 comprises one or more thermoelectric devices. The one or more thermoelectric devices are configured to adjust the temperature of the first flow of heat transfer fluid relative to the temperature of the second flow of heat transfer fluid. Each thermoelectric device can comprise a first surface thermally coupled to the first heat transfer region and a second surface thermally coupled to the second heat transfer region of the heat transfer unit 155. For instance, thermo-electric devices can sustain a temperature difference (between the first surface and the second surface) of (approximately) several tens of degrees (50-60° C.) or even on the order of a hundred degrees.

Accordingly, this temperature difference can affect comparable temperature differences between the central thermal zone of the substrate holder and the peripheral thermal zone of the substrate holder, for example. In operation, the thermoelectric devices are provided with varying current and voltage to compensate for or sustain any temperature differences required for the temperature control of heat transfer fluid delivered to the first fluid channel 140 and the second fluid channel 145. The thermoelectric devices are also able to adjust their temperatures more rapidly than the heat exchanger 150, for example.

Figure 2:
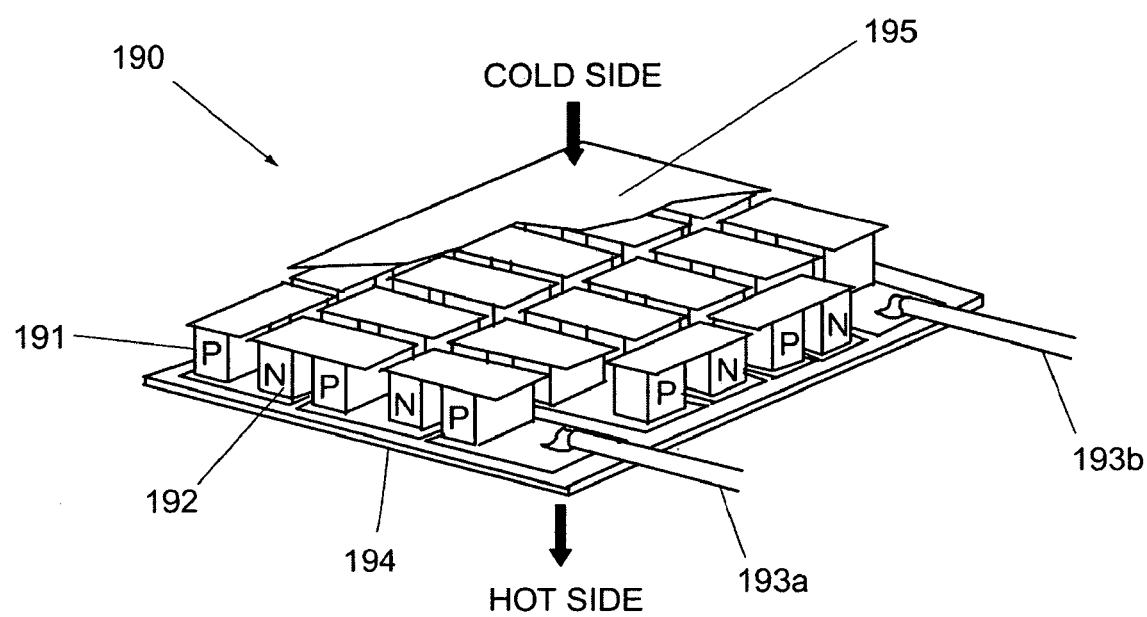
FIG. 2 is a schematic representation of a Peltier module according to an embodiment of the invention.

The plurality of thermoelectric devices may comprise Peltier modules. Peltier modules are small solid-state devices that function as heat pumps. These modules are based on the fact that application of voltage to two joint materials in some cases produces heat release or heat absorption, depending on the polarity, near the contact region. A Peltier module, according to an embodiment, is shown in FIG. 2. This module 190 includes p-type 191 and n-type 192 semiconductor materials connected by conductors 193a-b and enclosed between ceramic layers 194 and 195. In operation, when electric power is applied to the Peltier module, one side of the device becomes colder while the other side becomes hotter. Changing voltage polarity reverses the effect, and the side with the heat absorption becomes the heat releasing side, and vice versa. With these solid state devices, the heating power and the cooling power are approximately in direct proportion to the electric power or to the applied voltage.

Figure 3A:
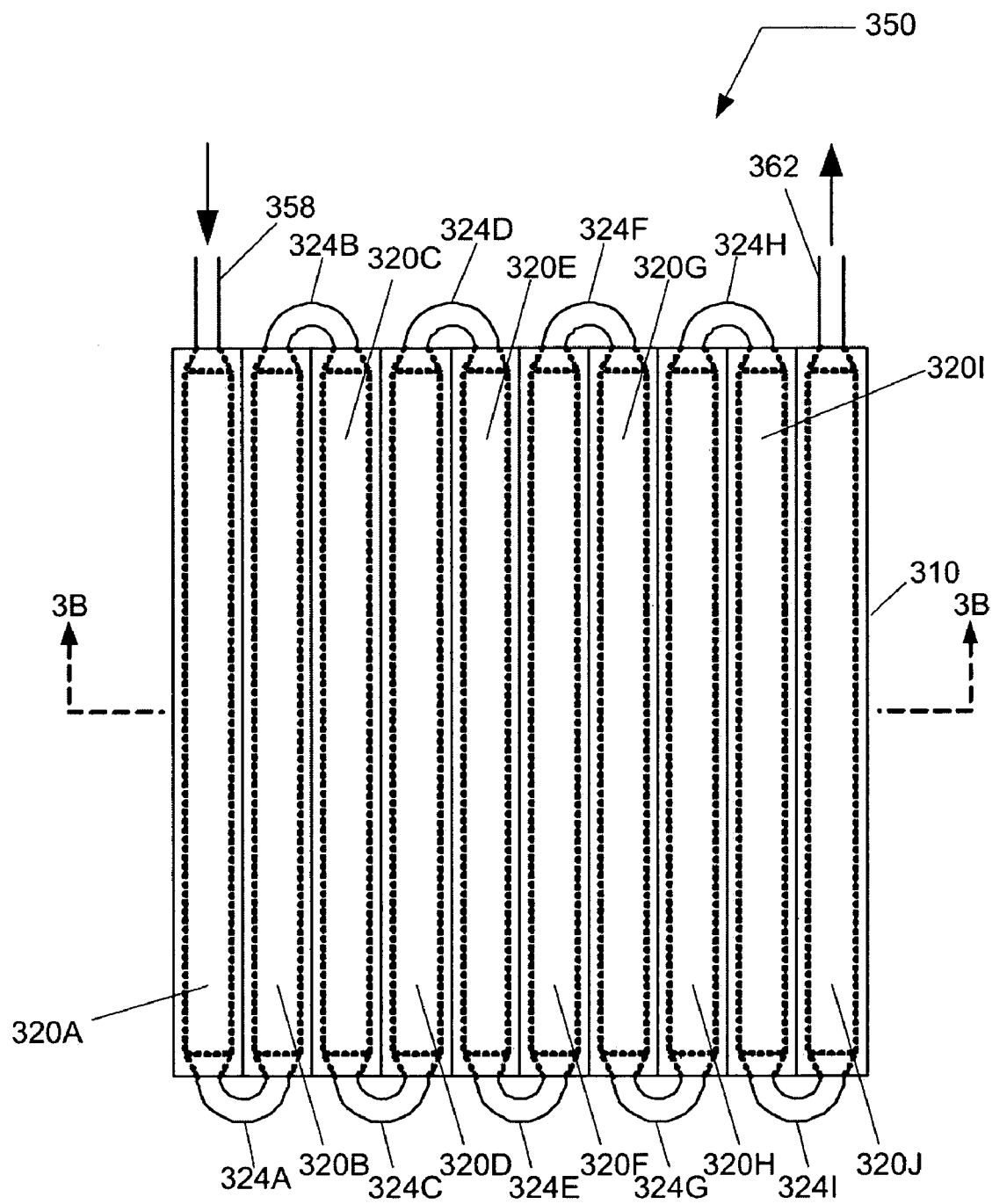
FIG. 3A depicts a top view of a heat transfer unit according to an embodiment of the invention.
Figure 3B:
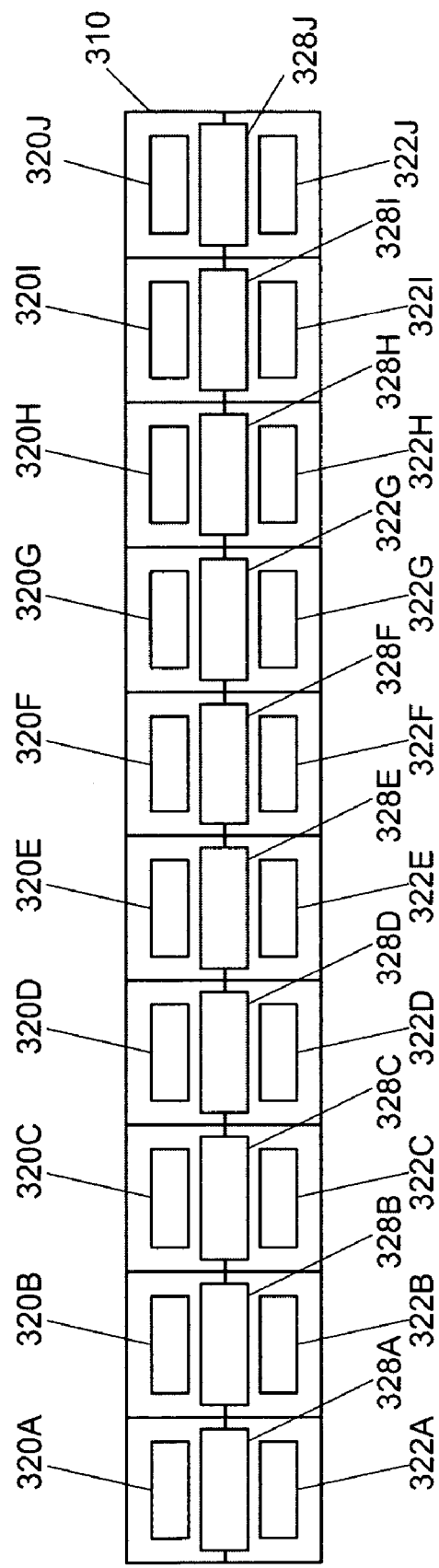
FIG. 3B depicts a cross-sectional view of the heat transfer unit shown in FIG. 3A.
Figure 3C:
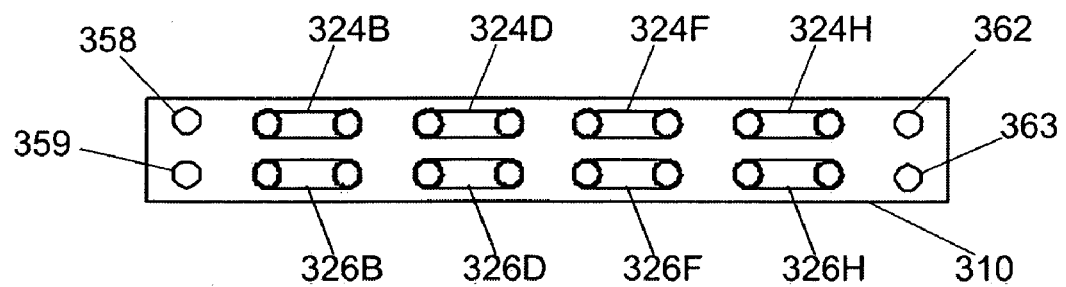
FIG. 3C depicts a end view of the heat transfer unit shown in FIG. 3A.
Figure 3D:
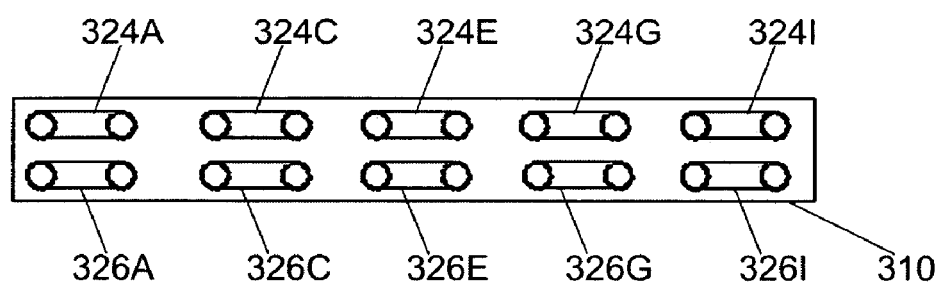
FIG. 3D depicts an opposing end view of the heat transfer unit shown in FIGS. 3A and 3C.

Referring now to FIGS. 3A through 3D, a heat transfer unit 350 is presented according to one embodiment. FIG. 3A represents a top view of the heat transfer unit 350 and FIG. 3B represents a cross-sectional view of the heat transfer unit 350 (as illustrated in FIG. 3A), while FIGS. 3C and 3D represent opposing end views of the heat transfer unit 350. The heat transfer unit 350 comprises a first fluid conduit having a first array of heat transfer segments 320A-J formed in a heat transfer unit housing 310, and a first array of conduit elbows 324A-J. The first fluid conduit receives heat transfer fluid at a first flow rate and bulk fluid temperature from a first inlet 358 and expels heat transfer fluid at the first flow rate and a first fluid temperature (different than the bulk fluid temperature) through a first outlet 362. Heat is transferred to or removed from the first flow of heat transfer fluid through the first array of heat transfer segments 320A-J. Although the first fluid conduit is shown to have ten (10) heat transfer segments, it may have more or less.

The heat transfer unit 350 comprises a second fluid conduit having a second array of heat transfer segments 322A-J and a second array of conduit elbows 326A-J. The second fluid conduit receives heat transfer fluid at a second flow rate and bulk fluid temperature from a second inlet 359 and expels heat transfer fluid at the second flow rate and a second fluid temperature (different than the bulk fluid temperature) through a second outlet 363. Heat is transferred to or removed from the second flow of heat transfer fluid through the second array of heat transfer segments 322A-J. Although the second fluid conduit is shown to have ten (10) heat transfer segments, it may have more or less.

The heat transfer unit 350 further comprises an array of thermo-electric devices 328A-J disposed between the first array of heat transfer segments 320A-J and the second array of heat transfer segments 322A-J. The array of thermo-electric devices 328A-J is configured to transfer heat between the first flow of heat transfer fluid and the second flow of heat transfer fluid. For example, each member of the array of thermoelectric devices 328A-J can comprise a plurality of Peltier modules.

Figure 4:
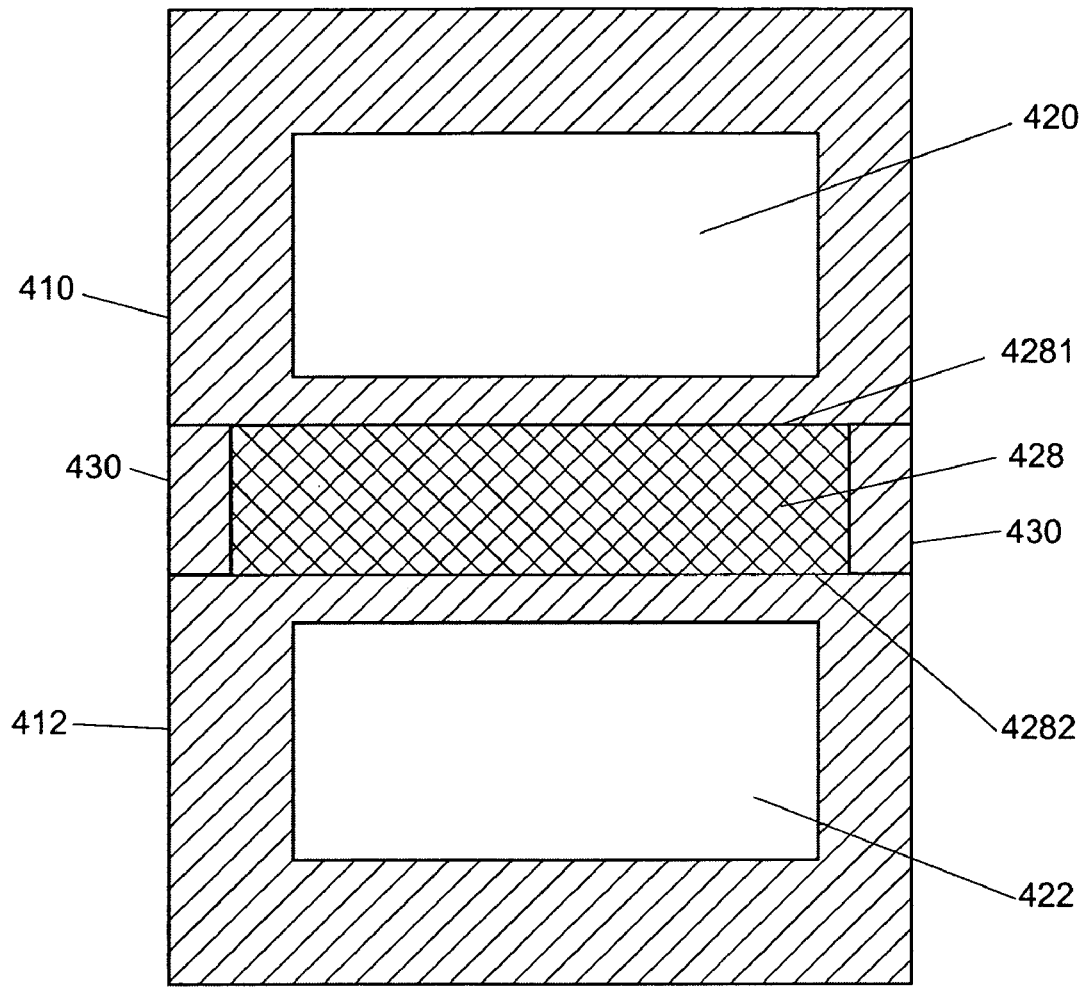
FIG. 4 depicts a partial cross-sectional view of a heat transfer unit according to another embodiment of the invention.

Referring now to FIG. 4, a partial cross-sectional view of a heat transfer unit is presented. The heat transfer unit comprises an upper housing 410 within which a first array of one or more heat transfer segments 420 are formed, and a lower housing 412 within which a second array of one or more heat transfer segments 422 are formed. One or more thermo-electric devices 428 are disposed between the first array of one or more heat transfer segments 420 and the second array of one or more heat transfer segments 422. The upper housing 410 and the lower housing 412 are further separated by one or more thermal insulation members 430. The one or more thermo-electric devices 428 are configured to adjust the temperature of a first flow of heat transfer fluid through the first array of one or more heat transfer segments 420 relative to the temperature of a second flow of heat transfer fluid through the second array of one or more heat transfer segments 422. Each thermo-electric device can comprise a first surface 4281 thermally coupled to the first array of one or more heat transfer segments 420 (first heat transfer region) and a second surface 4282 thermally coupled to the second array of one or more heat transfer-segments (second heat transfer region).

In one example, a heat transfer unit is described having a configuration as depicted in FIGS. 3A through 3D. A first conduit comprises ten (10) heat transfer segments (as illustrated in FIG. 3A), wherein the dimensions of each heat transfer segment includes a length (l) of approximately 600 mm and a cross-section of approximately 50 mm in width (W) and approximately 3 mm in height (H). Although the cross-section is depicted as rectangular, it may take on numerous shapes including circular. These dimensions provide for a cross-sectional area ($A_h$) approximately equivalent to a half inch diameter tube (i.e., approximately 150 mm$^2$). For instance, the first inlet 358 or second inlet 359, or the first outlet 362 or the second outlet 363, or any one of the first or second arrays of conduit elbows (324A-I, 326A-I) can comprise a half inch inner diameter (or approximately 12.5 mm). For instance, the inlets, outlets, conduit elbows, and heat transfer segments can be designed with approximately the same cross-sectional area. Since the first conduit comprises ten heat transfer segments, the effective length (L) becomes 10*l which equals 6000 mm. Therefore, the wetted surface area ($A_w$), directly coupled to a heat transfer surface, which, for instance, may be the first or second surface of the one or more thermo-electric devices, becomes $A_w = L*W = 3125$ mm$^2$.

Additionally, in this example, a second conduit comprises ten (10) heat transfer segments (as illustrated in FIG. 3B), wherein the dimensions of each heat transfer segment are configured the same as the first conduit. An array of thermoelectric devices (e.g., Peltier modules) is disposed between the first and second conduit as illustrated in FIGS. 3A and 3B. In particular, for instance, an array of approximately twelve (12) (50 mm by 50 mm) Peltier modules can be located between each heat transfer segment for the first and second conduits.

Provided the geometry for the heat transfer unit, Table 1 presents the change in temperature ($\Delta T_2$) across each Peltier module that is required to achieve a difference in temperature ($\Delta T_1$) between the first fluid temperature and the second fluid temperature of 5° C. as a function of volume flow rate (V) through each conduit (i.e., the first and second conduit).

TABLE 1

| V (lpm) | V (m^3/sec) | m (Kg/sec) | u (m/sec) | Re | Nu | h (J/m^2 - K) | Q1 (W) | ΔT2 (C.) |
|---|---|---|---|---|---|---|---|---|
| 10 | 0.000167 | 0.307 | 1.067 | 6666.7 | 89.3 | 471.37 | 802.7 | 11.35 |
| 20 | 0.000333 | 0.613 | 2.133 | 13333.3 | 155.4 | 820.71 | 1605.4 | 13.04 |
| 30 | 0.000500 | 0.920 | 3.200 | 20000.0 | 215.0 | 1135.17 | 2408.1 | 14.14 |
| 40 | 0.000667 | 1.227 | 4.267 | 26666.7 | 270.6 | 1428.93 | 3210.8 | 14.98 |
| 50 | 0.000833 | 1.533 | 5.333 | 33333.3 | 323.5 | 1708.20 | 4013.5 | 15.66 |

Table 1 provides the volume flow rate (V) (liters per minute, lpm; and cubic meters per second, m³/sec), the mass flow rate (m=ρ*V) (when using the heat transfer fluid, Galden HT-200: density, ρ=1840 Kg/m³; thermal conductivity, k=0.066 J/m-K; dynamic viscosity, ν=2.0E-06 m²/sec; specific heat, $c_p$=1047 J/Kg-K; Prandtl number=58.4; for 20° C.), and the flow velocity (u=m/(ρ$A_h$)) (meters per second, m/sec). From these flow parameters, the Reynolds number (Re=u*$d_h$/ν) (based upon the hydraulic diameter ($d_h$=sqrt (4*$A_h$/π))) and the Nusselt number (Nu=0.023*$Re^{4/5}$*$Pr^{0.3}$) (based upon an empirical formulation for turbulent flow in a pipe) are determined, from which a heat transfer coefficient (h=Nu*k/$d_h$) (J/m²-K)) can be calculated for thermal transport through the fluid boundary layer formed on the wetted area of the heat transfer surface.

Now, the power required to be transferred to or removed from the heat transfer fluid in order to adjust the fluid temperature from the bulk fluid temperature ($T_b$) to the first fluid temperature ($T_1$) (or the second fluid temperature ($T_2$)), for a given mass flow rate (m), is $Q_1$=m*$c_p$*($T_b$-$T_1$) (Watts, W). Additionally, the power that must be transported through the fluid boundary layer to meet this requirement is given by $Q_2$=h*$A_w$*(T-$T_s$), where T is the fluid temperature and $T_s$ is the surface temperature of the heat transfer surface. By setting $Q_1$ equivalent to $Q_2$, the required change in temperature (Δ$T_2$) across each Peltier module can be determined.

Table 2 presents the calculation for achieving a temperature difference (Δ$T_1$) of 10° C. and Table 3 presents the calculation for achieving a temperature difference (Δ$T_1$) of 20° C. The temperature difference across each Peltier module varies from approximately 10° C. to approximately 60° C. in order to achieve a difference in fluid temperatures of 5° C., 10° C. and 20° C., respectively. These temperature differences are well within the current limitations of commercially available thermo-electric devices.

Referring again to FIG. 1, a controller 160 comprises a microprocessor, memory, and a digital I/O port capable of generating control voltages sufficient to communicate and activate inputs to material processing system 100 as well as monitor outputs from material processing system 100. Moreover, controller 160 can be coupled to and can exchange information with the gas injection system 118, the vacuum pumping system 130, the heat exchanger 150, the heat transfer unit 155, a high voltage direct current (DC) voltage supply, not shown, facilitating electrostatic clamping of the substrate 135, and a backside gas supply system, also not shown. For example, a program stored in the memory can be utilized to activate the inputs to the aforementioned components of material processing system 100 according to a process recipe in order to perform the method of controlling a substrate temperature. One example of controller 160 is a DELL PRECISION WORKSTATION 640™, available from Dell Corporation, Austin Tex. However, the controller 160 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 160 includes at least one computer readable medium or memory, such as the controller memory, for holding instructions programmed according to the teachings of the invention and for containing data structures, tables,

TABLE 2

| V (lpm) | V (m^3/sec) | m (Kg/sec) | u (m/sec) | Re | Nu | h (J/m^2 - K) | Q1 (W) | ΔT2 (C.) |
|---|---|---|---|---|---|---|---|---|
| 10 | 0.000167 | 0.307 | 1.067 | 6666.7 | 89.3 | 471.37 | 1605.4 | 22.71 |
| 20 | 0.000333 | 0.613 | 2.133 | 13333.3 | 155.4 | 820.71 | 3210.8 | 26.08 |
| 30 | 0.000500 | 0.920 | 3.200 | 20000.0 | 215.0 | 1135.17 | 4816.2 | 28.28 |
| 40 | 0.000667 | 1.227 | 4.267 | 26666.7 | 270.6 | 1428.93 | 6421.6 | 29.96 |
| 50 | 0.000833 | 1.533 | 5.333 | 33333.3 | 323.5 | 1708.20 | 8027 | 31.33 |

TABLE 3

| V (lpm) | V (m^3/sec) | m (Kg/sec) | u (m/sec) | Re | Nu | h (J/m^2 - K) | Q1 (W) | ΔT2 (C.) |
|---|---|---|---|---|---|---|---|---|
| 10 | 0.000167 | 0.307 | 1.067 | 6666.7 | 89.3 | 471.37 | 3210.8 | 45.41 |
| 20 | 0.000333 | 0.613 | 2.133 | 13333.3 | 155.4 | 820.71 | 6421.6 | 52.16 |
| 30 | 0.000500 | 0.920 | 3.200 | 20000.0 | 215.0 | 1135.17 | 9632.4 | 56.57 |
| 40 | 0.000667 | 1.227 | 4.267 | 26666.7 | 270.6 | 1428.93 | 12843.2 | 59.92 |
| 50 | 0.000833 | 1.533 | 5.333 | 33333.3 | 323.5 | 1708.20 | 16054 | 62.65 | records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 160, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 160 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 160.

Controller 160 can be locally located relative to the material processing system 100, or it can be remotely located relative to the material processing system 100. For example, controller 160 can exchange data with material processing system 100 using at least one of a direct connection, an intranet, and the internet. Controller 160 can be coupled to an intranet at, for example, a customer site (i.e., a device maker, etc.), or it can be coupled to an intranet at, for example, a vendor site (i.e., an equipment manufacturer). Additionally, for example, controller 160 can be coupled to the internet. Furthermore, another computer (i.e., controller, server, etc.) can, for example, access controller 160 to exchange data via at least one of a direct connection, an intranet, and the internet.

Figure 5:
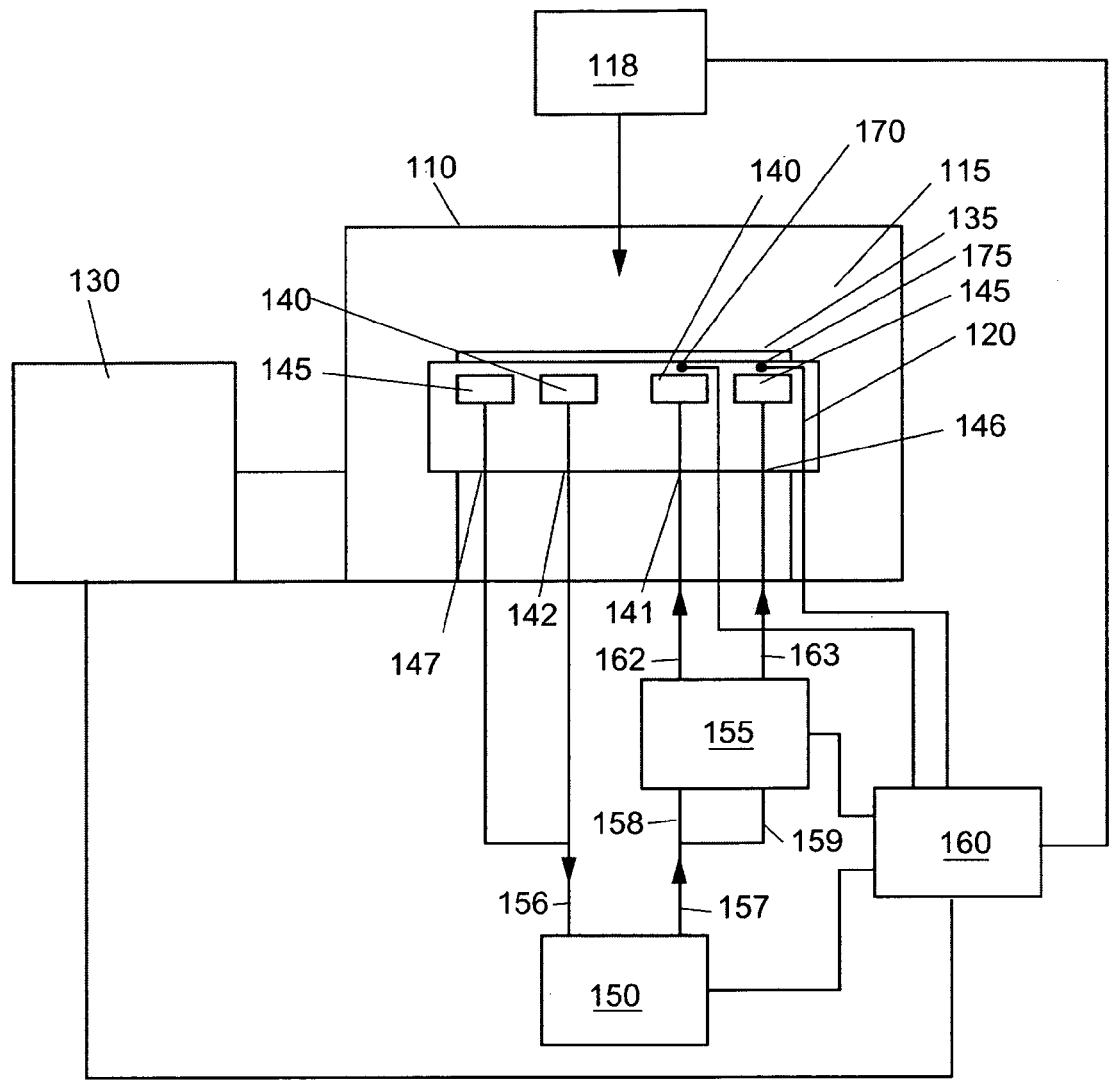
FIG. 5 depicts a simplified block diagram of a processing system having a substrate holder according to another embodiment of the invention.

According to another illustrated embodiment of a processing system 200 depicted in FIG. 5, the substrate holder 120 can further include two or more temperature sensors 170 and 175 located proximate the first (center) thermal zone and the second (peripheral or edge) thermal zone, respectively. Temperature sensors can include a thermocouple (e.g., a K-type thermocouple). Alternatively, temperature sensors can include an optical fiber thermometer commercially available from Advanced Energies, Inc. (1625 Sharp Point Drive, Fort Collins, Colo., 80525), Model No. OR2000F capable of measurements from 50 to 2000° C. and an accuracy of plus or minus 1.5° C., or a band-edge temperature measurement system as described in pending U.S. patent application Ser. No. 10/168,544, filed on Jul. 2, 2002, entitled "Method of Wafer Band-Edge Measurement Using Transmission Spectroscopy and a Processor Controlling the Temperature Uniformity of a Wafer", the contents of which are incorporated herein by reference in their entirety. The two or more temperature sensors 170 and 175 can provide temperature measurements to controller 160 as feedback to a control algorithm implemented to obtain a target temperature distribution.

For example, the controller 160 can adjust either the electrical current or voltage polarity to the one or more thermoelectric devices in order to adjust the first fluid temperature of the heat transfer fluid relative to the second fluid temperature of the heat transfer fluid. Additionally, the controller 160 may adjust the bulk fluid temperature, the bulk flow rate, the first flow rate, or the second flow rate.

Figure 6:
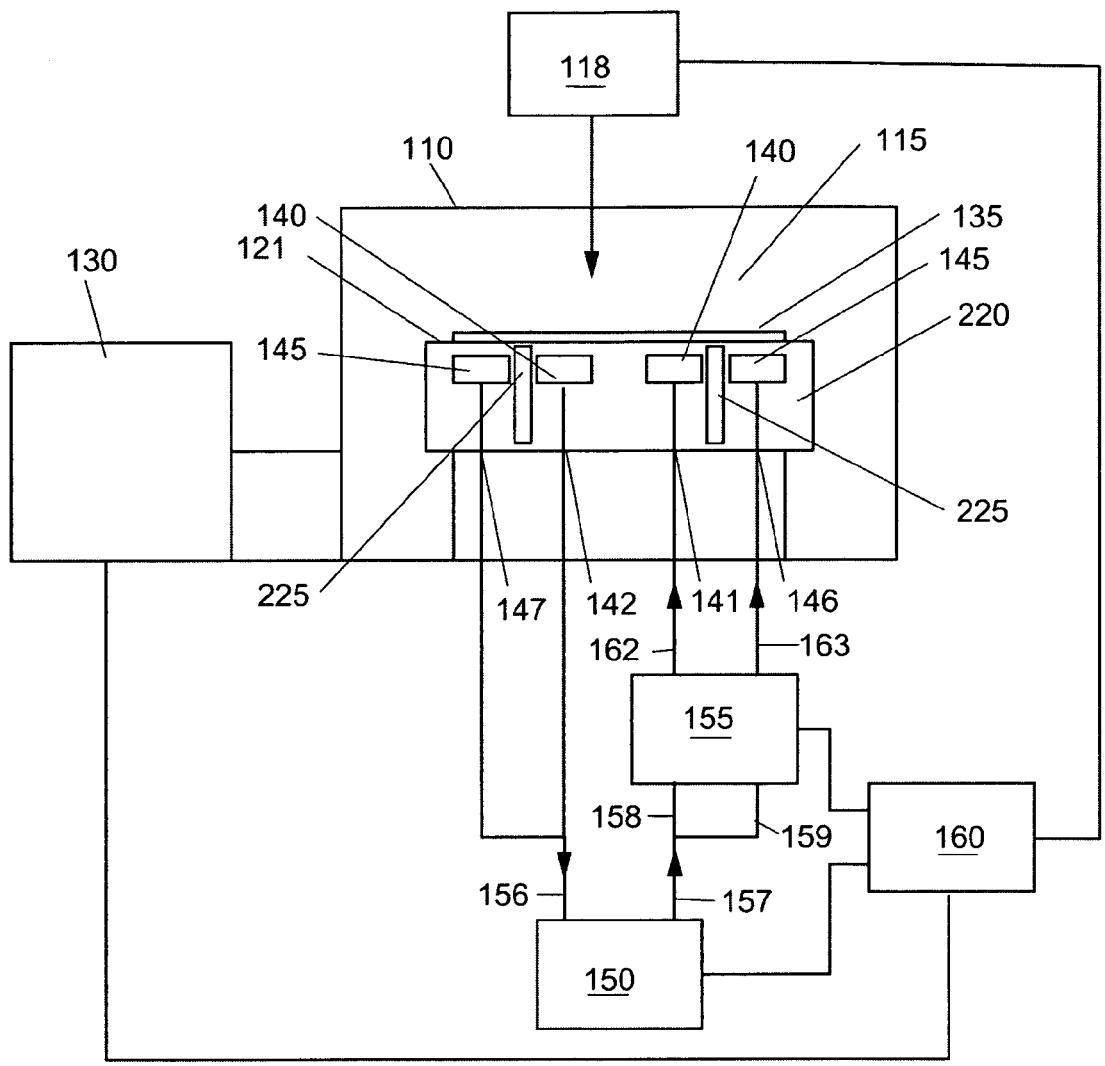
FIG. 6 depicts a simplified block diagram of a processing system having a substrate holder according to another embodiment of the invention.

According to another illustrated embodiment depicted in FIG. 6, a material processing system 300 can be similar to the embodiments of FIG. 1 and FIG. 5, and can comprise a substrate holder 220 further including a thermal insulator 225 positioned between the first fluid channel 140 and the second fluid channel 145. The thermal insulator 225 is substantially concentric with the first fluid channel 140 and the second fluid channel 145. The thermal insulator 225 is inserted between the first fluid channel 140 and the second fluid channel 145 to laterally insulate the controllable thermal zones in the substrate holder 220. Thermal insulator 225 can be any material or combination of materials with a low thermal conductivity (relative to the thermal conductivity of the substrate holder 220). Alternatively, thermal insulator 225 can include an insulator with an adjustable thermal conductivity, such as a gas gap with variable pressure. Additional details can be found in pending U.S. patent application Ser. No. 10/721,500, filed on Nov. 26, 2003, entitled "Method and System for Substrate Temperature Profile Control", which is herein incorporated by reference in its entirety.

Figure 7:
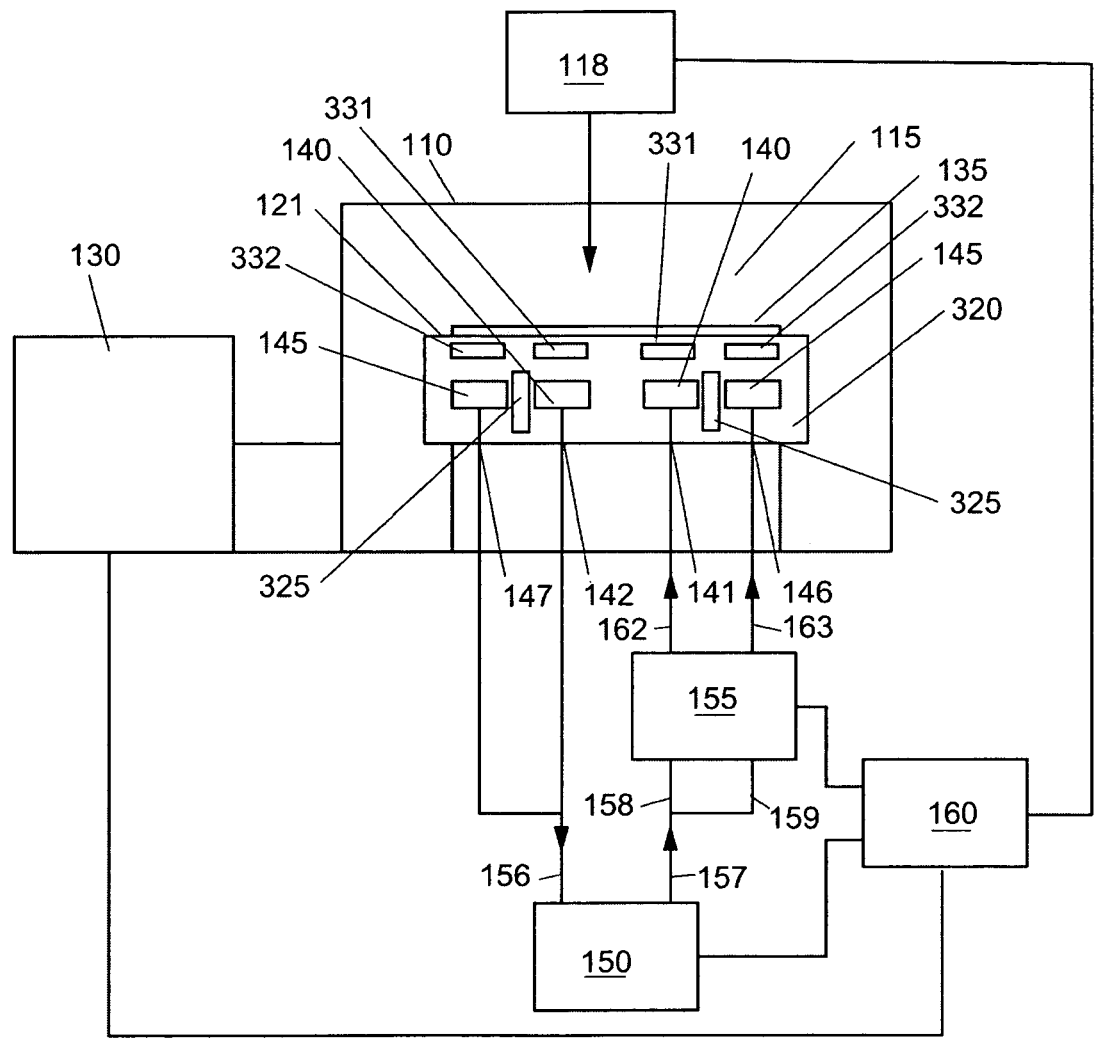
FIG. 7 depicts a simplified block diagram of a processing system having a substrate holder according to another embodiment of the invention.

According to another illustrated embodiment depicted in FIG. 7, a material processing system 400 can be similar to the embodiments of FIG. 1, FIG. 5 and FIG. 6, and can comprise a substrate holder 320 further including two or more temperature control elements 331 and 332. Each temperature control element, i.e., 331 and 332, can, for example, include another fluid channel for flowing a heat transfer fluid, a resistive heating element, or a thermoelectric device (or array thereof). Additionally, substrate holder 320 can optionally include thermal insulator 325. The use of the two or more temperature control elements, located above the first and second fluid channels 140 and 145, can provide additional control for heating and cooling substrate 135.

Figure 8:
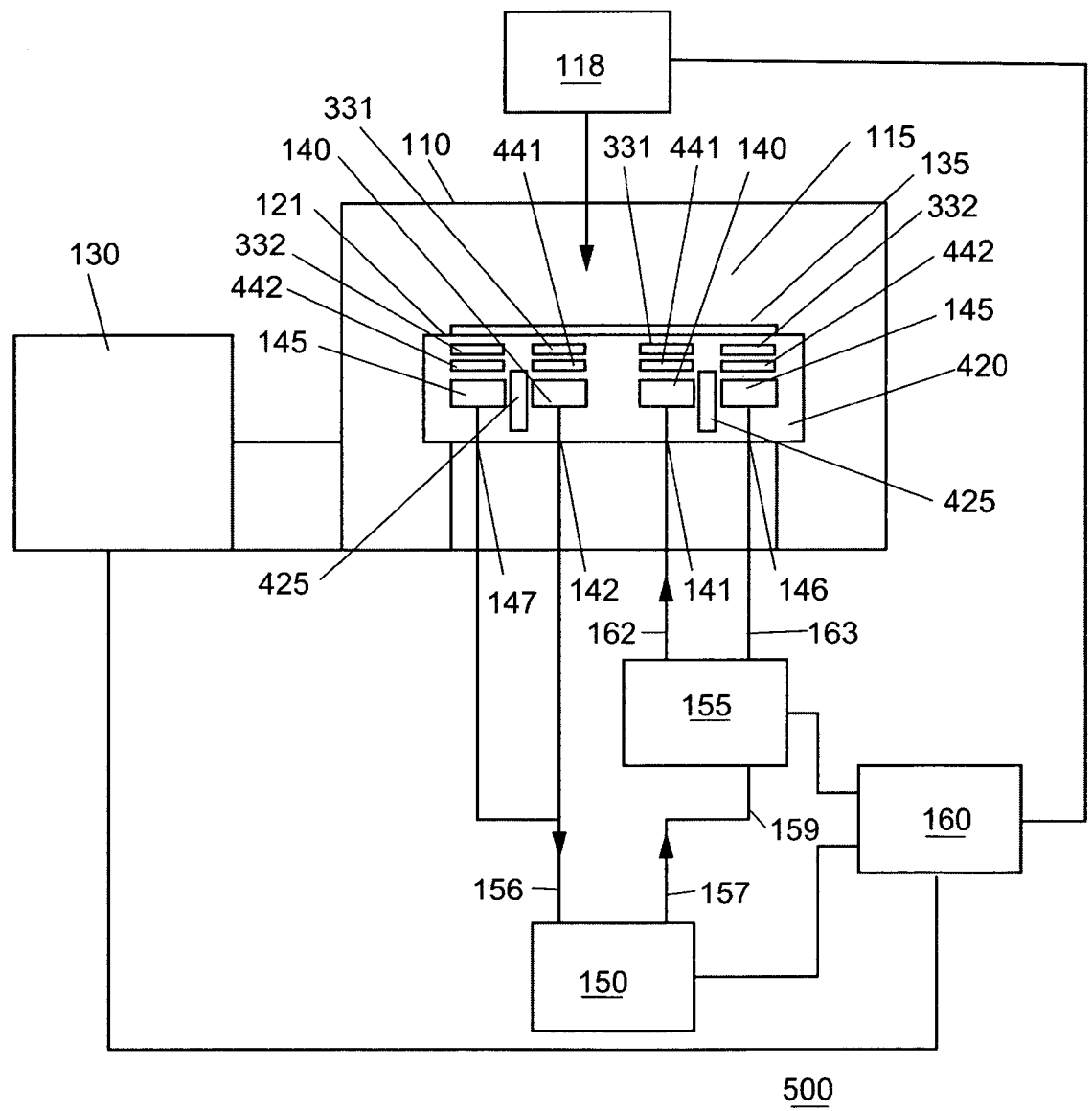
FIG. 8 depicts a simplified block diagram of a processing system having a substrate holder according to another embodiment of the invention.

According to another illustrated embodiment depicted in FIG. 8, a material processing system 500 can be similar to the embodiments of FIG. 1, FIG. 5, FIG. 6, and FIG. 7, and can comprise a substrate holder 420 further including two or more controllable insulation elements 441 and 442. Each controllable insulation element, i.e., 441 and 442, can include a gas gap having a variable pressure in order to vertically control the flow of heat within substrate holder 420. Additional details can be found in U.S. Provisional Ser. No. 60/458,053, filed on Mar. 28, 2003, entitled "Method and System for Temperature Control of a Substrate", the entire contents of which are herein incorporated by reference.

Figure 9:
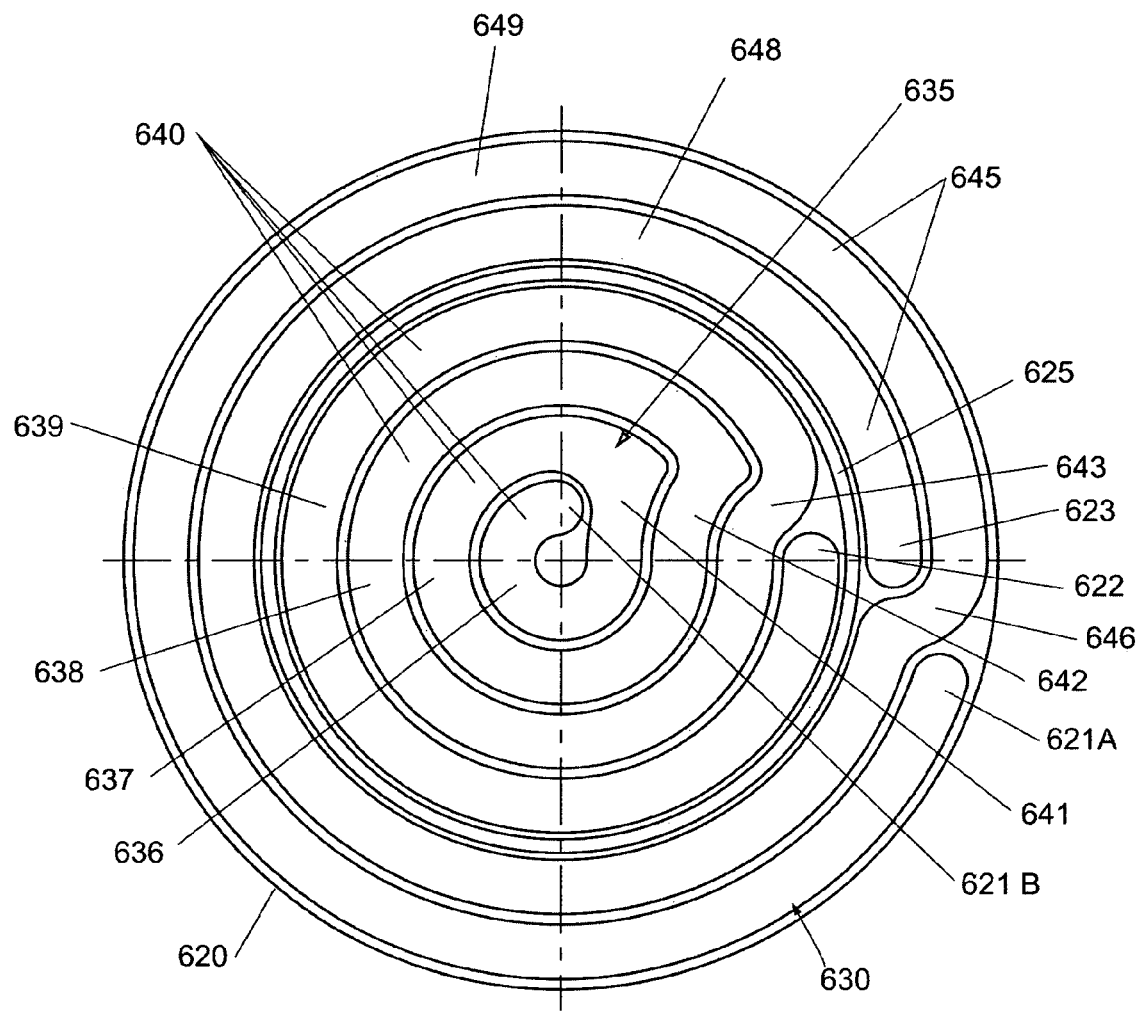
FIG. 9 depicts exemplary geometry for first and second fluid channels including first and second thermal zones.

According to another illustrated embodiment depicted in FIG. 9, a substrate holder can, for example, be similar to the embodiments of FIG. 6, and can comprise a substrate holder 620 further including two separate thermal zones. Central thermal zone 635 provides temperature control of the central portion of the substrate holder 620. Outer thermal zone 630 provides temperature control of the peripheral portion of the substrate holder 620. An optional thermal insulator 625 can separate thermal zone 635 and thermal zone 630.

Central thermal zone 635 consists of fluid channel 640 formed in parts by concentric circular paths 636, 637, 638, and 639. The concentric circular paths 636, 637, 638, and 639 are connected by respective linking legs 641, 642, and 643. This geometry maximally approaches azimuthal symmetry as the circular geometry is interrupted only at one position between adjacent circular paths in the area of the linking leg. Heat transfer fluid is circulates through the central thermal zone 635, entering at location 621B and returning at location 622.

In a like manner, outer thermal zone 630 consists of fluid channel 645 formed in parts by concentric circular paths 648, and 649. The concentric circular paths 648, and 649 are connected by respective linking leg 646. This geometry, as described above, also maximally approaches azimuthal symmetry as the circular geometry is interrupted only at one position between adjacent circular paths in the area of the linking leg. Heat transfer fluid is circulated through the outer thermal zone 630, entering at location 623 and returning at location 621A.

Figure 10:
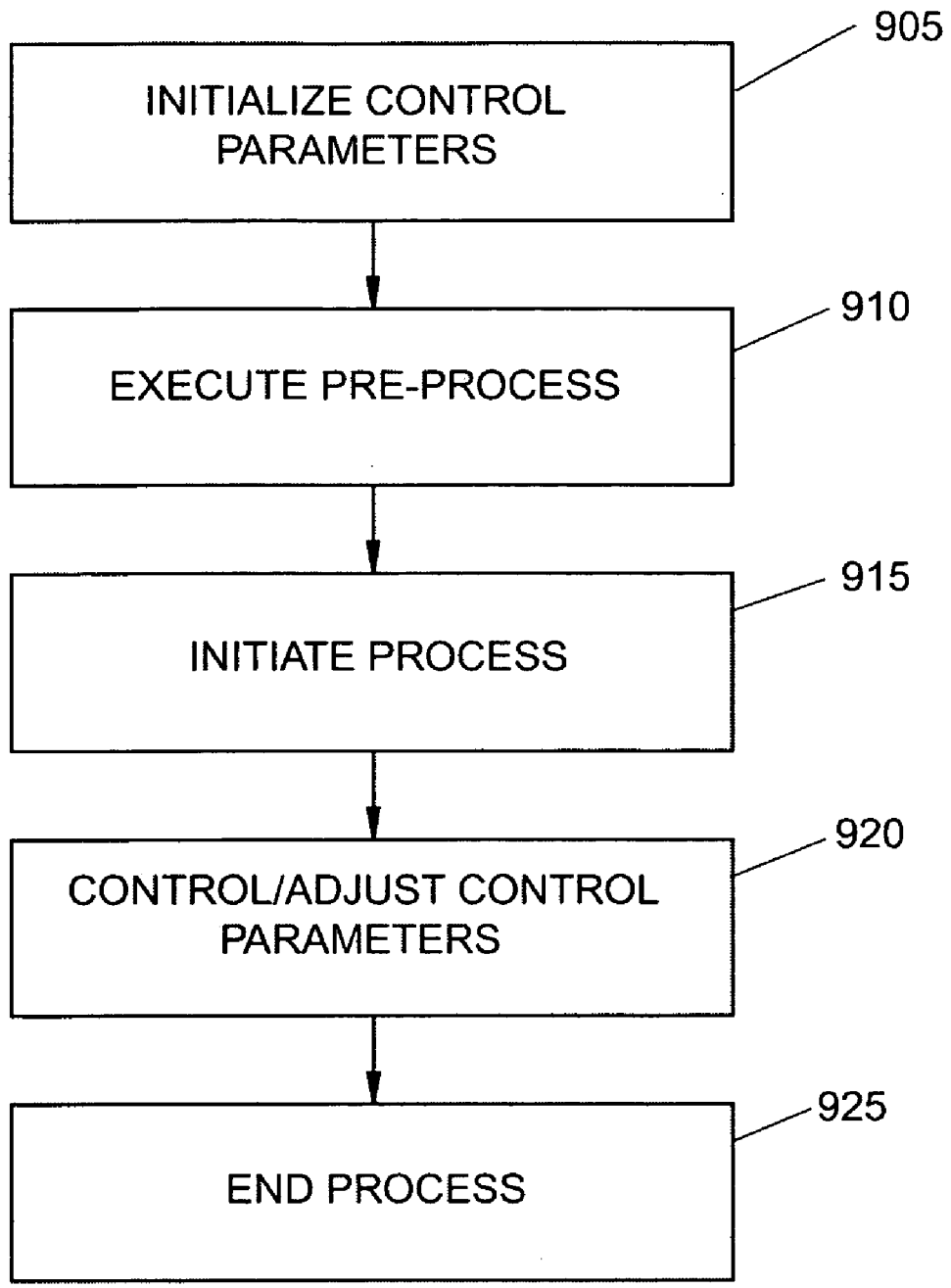
FIG. 10 illustrates a method of operating a temperature control system according to an embodiment of the invention.

FIG. 10 presents a flowchart describing a method 900 of controlling the temperature profile of a substrate on a substrate holder in a processing system. The temperature profile scheme can pertain to multiple process steps for a process in a process system. The substrate holder can comprise one of those described in FIG. 1, FIG. 5, FIG. 6, FIG. 7, or FIG. 8. The method 900 begins in 905 with initializing the control parameters for controlling the temperature profile of the substrate. As used herein, "controlling the temperature profile" means independently controlling different spatial regions of a substrate holder to achieve either a uniform or non-uniform substrate temperature. The control parameters comprise the input parameters for a first thermal zone and the input parameters for a second thermal zone. The control parameters can further comprise, but are not limited to, the input parameters for the thermoelectric device(s) electrical current, voltage and polarity, the input parameters for the electrostatic clamp HV DC power supply voltage, the input parameter for the electrostatic clamp HV DC power supply current, the input parameters for the backside gas supply system, the input parameters of the gas injection system, the input parameters of the vacuum pumping system, etc. The input parameters for the first and second thermal zones can, for example, comprise a fluid flow rate (or velocity), or a fluid temperature, or both. The input parameter for the electrostatic clamp HV DC power supply voltage can, for example, comprise a clamping voltage. The input parameter for the electrostatic clamp HV DC power supply current can, for example, comprise a clamping current. The input parameter for a backside gas supply system can, for example, comprise a backside flow rate, a backside pressure, or a backside gas type. The input parameter for a gas injection system can, for example comprise a gas injection flow rate or rates, a gas injection pressure or pressures, or a gas injection gas type or types.

In 910 the control parameters established in 905 can be set in order to perform pre-processing of the substrate, the substrate holder, or the processing system, or any combination of two or more thereof. Pre-processing of the substrate may, for example, include clamping the substrate, establishing the pre-determined backside pressure, adjusting the temperature of the substrate to the pre-specified value, etc.

In 915 the process is initiated in the processing system for treating the substrate, and, in 920 the control parameters are controlled and/or adjusted. The control parameters can be controlled and/or adjusted according to a predetermined process recipe. Alternately, the control parameters can be controlled and/or adjusted according to a comparison of temperature measurements using temperature-sensing devices (temperature sensors) with process conditions dictated by a process recipe. Alternately, the control parameters can be controlled and/or adjusted according to a combination of a predetermined process recipe and a comparison of temperature measurements using temperature sensing devices with process conditions dictated by a process recipe.

In 925, the process is terminated, and, thereafter, the control parameters can, optionally, be controlled and/or adjusted in order to post-process at least one of the substrate, the substrate holder, or the processing system.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A temperature control system, comprising:
a first fluid channel coupled to a first thermal region of a processing element in a processing system, and configured to receive a first flow of heat transfer fluid at a first fluid temperature;
a second fluid channel coupled to a second thermal region of said processing element in said processing system, and configured to receive a second flow of heat transfer fluid at a second fluid temperature;
a heat exchanger unit configured to provide a bulk flow of heat transfer fluid at a bulk fluid temperature, wherein said bulk flow of said heat transfer fluid supplies said first flow of said heat transfer fluid and said second flow of said heat transfer fluid; and
a heat transfer unit coupled to said heat exchanger and configured to receive said bulk flow of heat transfer fluid, wherein said heat transfer unit is configured to provide said first flow of heat transfer fluid at said first fluid temperature and provide said second flow of heat transfer fluid at said second fluid temperature by transferring heat between a first heat transfer region through which said first flow passes and a second heat transfer region through which said second flow passes.

2. The temperature control system of claim 1, wherein said heat transfer unit transfers heat from said first flow of heat transfer fluid to said second flow of heat transfer fluid such that said first fluid temperature is less than said bulk fluid temperature and said second fluid temperature is greater than said bulk fluid temperature.

3. The temperature control system of claim 1, wherein said heat transfer unit comprises one or more thermo-electric devices having a first surface coupled to said first heat transfer region and a second surface coupled to said second heat transfer region, wherein said one or more thermo-electric devices are coupled to a power source in order to generate a temperature difference between said first surface and said second surface.

4. The temperature control system of claim 3, wherein the magnitude of said temperature difference between said first surface and said second surface of said one or more thermo-electric devices is varied by adjusting an electrical current coupled from said power source to said one or more thermo-electric devices.

5. The temperature control system of claim 3, wherein the direction of heat transfer between said first flow of heat transfer fluid and said second flow of heat transfer fluid is varied by adjusting the polarity of an electrical voltage coupled from said power source to said one or more thermo-electric devices.

6. The temperature control system of claim 3, further comprising:
a first temperature sensor located proximate said first thermal region, and configured to measure a first temperature of said processing element;
a second temperature sensor located proximate said second thermal region, and configured to measure a second temperature of said processing element; and
a controller coupled to said first temperature sensor, said second temperature sensor, and said power source, and configured to adjust an electrical current, or a voltage polarity, or both coupled from said power source to said one or more thermo-electric devices using said first temperature and said second temperature to achieve a target temperature distribution.

7. The temperature control system of claim 1, wherein said heat transfer unit comprises a first inlet coupled to said first heat transfer region and a second inlet coupled to said second heat transfer region, and wherein said first inlet and said second inlet are coupled to an outlet of said heat exchanger such that said bulk flow of heat transfer fluid is split to form said first flow and said second flow.

8. The temperature control system of claim 1, wherein said heat transfer unit comprises a first outlet coupled to said first heat transfer region and an inlet of said first fluid channel, and a second outlet coupled to said second heat transfer region and an inlet of said second fluid channel.

9. The temperature control system of claim 1, wherein said heat exchanger is coupled to an outlet of said first fluid channel and an outlet of said second fluid channel, and configured to receive said heat transfer fluid from said first fluid channel and said second fluid channel.

10. The temperature control system of claim 1, wherein said processing element comprises a substrate holder in said processing system.

11. The temperature control system of claim 10, wherein said first thermal region is proximate a central portion of said substrate, and said second thermal region is proximate an edge portion of said substrate.

12. The temperature control system of claim 10, wherein said substrate comprises a semiconductor wafer.

13. The temperature control system of claim 10, wherein said substrate is clamped to said substrate holder.

14. The temperature control system of claim 10, wherein a heat transfer gas is provided to a space between a backside surface of said substrate and an upper surface of said substrate holder.

15. The temperature control system of claim 1, further comprising:
a controller coupled to said heat exchanger and configured to adjust the flow rate of said bulk flow of heat transfer fluid or said bulk fluid temperature or both.

16. The temperature control system of claim 1, further comprising:
a controller coupled to said heat transfer unit and configured to adjust the flow rate of said first flow of heat transfer fluid, said first fluid temperature, the flow rate of said second flow of heat transfer fluid, or said second fluid temperature, or any combination of two or more thereof.

17. A method of controlling temperature of a substrate held on a substrate holder using the temperature control system of claim 1, comprising:
providing a first heat transfer fluid to said first fluid channel;
providing a second heat transfer fluid to said second fluid channel; and
controlling a first fluid temperature of said first heat transfer fluid relative to a second fluid temperature of said second heat transfer fluid using said heat transfer unit.

18. A computer readable medium containing program instructions for execution on a computer system, which when executed by the computer system, cause the computer system to control the temperature control system of claim 1 to perform the steps of:
providing a first heat transfer fluid to said first fluid channel;
providing a second heat transfer fluid to said second fluid channel; and
controlling a first fluid temperature of said first heat transfer fluid relative to a second fluid temperature of said second heat transfer fluid using said heat transfer unit.

19. The temperature control system of claim 1, wherein said heat transfer unit comprises:
a first array of heat transfer segments coupled to said first heat transfer region;
a second array of heat transfer segments coupled to said second heat transfer region; and
a plurality of thermo-electric devices disposed between each of said first array of heat transfer segments and each of said second array of heat transfer segments, each of said plurality of thermo-electric devices comprises a first surface thermally coupled to one of said first array of heat transfer segments and a second surface thermally coupled to one of said second array of heat transfer segments.

20. A temperature control system, comprising:
a first thermal region of a processing element in a processing system, configured to receive a first flow of heat transfer fluid at a first fluid temperature;
a second thermal region of said processing element in said processing system, configured to receive a second flow of heat transfer fluid at a second fluid temperature; and
a heat transfer unit which transfers heat between said first flow of heat transfer fluid and said second flow of heat transfer fluid such that said first temperature is different than said second fluid temperature,
wherein said heat transfer unit comprises a first housing within which is formed a first array of heat transfer segments connected serially in a serpentine-like manner and configured to receive said first flow of heat transfer fluid, a second housing within which is formed a second array of heat transfer segments connected serially in a serpentine-like manner and configured to receive said second flow of heat transfer fluid, and a plurality of thermo-electric devices disposed between said first array of heat transfer segments and said second array of heat transfer segments, each of said plurality of thermo-electric devices comprises a first surface thermally coupled to one of said first array of heat transfer segments and a second surface thermally coupled to one of said second array of heat transfer segments, and
wherein said heat transfer unit is configured to achieve a difference in temperature between said first flow and said second flow of up to 20 degrees C. for a flow rate of said first flow ranging up to 50 liters per minute, a flow rate of said second flow ranging up to 50 liters per minute, and a temperature difference between said first surface and said second surface less than about 60 degrees C.

* * * * *